(12) United States Patent
Suzuki et al.

(10) Patent No.: US 8,685,758 B2
(45) Date of Patent: Apr. 1, 2014

(54) THERMOELECTRIC CONVERSION MODULE AND METHOD OF RESTORING THE SAME

(75) Inventors: Takashi Suzuki, Kawasaki (JP); Takuya Nishino, Kawasaki (JP)

(73) Assignee: Fujitsu Limited, Kawasaki, (JP)

( * ) Notice: Subject to any disclaimer, the term of this patent is extended or adjusted under 35 U.S.C. 154(b) by 443 days.

(21) Appl. No.: 13/186,019

(22) Filed: Jul. 19, 2011

(65) Prior Publication Data

US 2011/0275165 A1 Nov. 10, 2011

Related U.S. Application Data

(63) Continuation of application No. PCT/JP2009/056656, filed on Mar. 31, 2009.

(51) Int. Cl.
*H01L 21/00* (2006.01)

(52) U.S. Cl.
USPC ............... 438/4; 136/200; 136/201; 136/204; 136/205; 257/E21.158

(58) Field of Classification Search
USPC .............. 438/4; 136/224, 200–201, 204–205; 257/E21.158
See application file for complete search history.

(56) References Cited

U.S. PATENT DOCUMENTS 6,028,263 A 2/2000 Kobayashi et al.

FOREIGN PATENT DOCUMENTS

| JP | 62-070458 A | 3/1987 |
| JP | 08-032125 A | 2/1996 |
| JP | 08-335723 A | 12/1996 |
| JP | 10-144970 A | 5/1998 |
| JP | 11-032492 A | 2/1999 |
| JP | 2008-091442 A | 4/2008 |
| WO | 2009/031698 A1 | 3/2009 |

OTHER PUBLICATIONS

International Search Report for PCT/JP2009/056656, mailing date of Jun. 2, 2009.

*Primary Examiner* — Mark A Laurenzi
(74) *Attorney, Agent, or Firm* — Westerman, Hattori, Daniels & Adrian, LLP

(57) ABSTRACT

A thermoelectric conversion module includes a pair of heat transfer plates, p-type semiconductor blocks and n-type semiconductor blocks arranged between the heat transfer plates, and terminal electrodes formed respectively on inner surfaces of the heat transfer plates and connecting the semiconductor blocks in series. The heat transfer plates include holes reaching from an outer surface to the terminal electrodes, and grooves each formed between the terminal electrodes and communicating between the adjacent holes. If a disconnection occurs, for example, a pin of a tester is brought into contact with the terminal electrode via the hole to specify a disconnected portion, and the terminal electrodes are electrically connected by injecting conductive paste into the holes in the disconnected portion as well as the groove.

19 Claims, 10 Drawing Sheets

THERMOELECTRIC CONVERSION MODULE AND METHOD OF RESTORING THE SAME

CROSS-REFERENCE TO RELATED APPLICATIONS

This application is a continuation of the prior International Patent Application No. PCT/JP2009/056656, filed Mar. 31, 2009, the entire contents of which are incorporated herein by reference.

FIELD

The embodiments discussed herein are related to a thermoelectric conversion module including a plurality of blocks each formed of a thermoelectric element material and to a method of restoring the same.

BACKGROUND

Thermoelectric conversion elements include a thermoelectric generating element, which generates power by use of heat, and a Peltier element, which transfers heat by use of electricity. Basic structures of the thermoelectric generating element and the Peltier element are the same.

A thermoelectric conversion element includes: a pair of heat transfer plates made of an insulator such as alumina with good thermal conductivity; p-type semiconductor blocks and n-type semiconductor blocks arranged between those heat transfer plates; and electrodes serially connecting the p-type semiconductor blocks and the n-type semiconductor blocks. Since it may not be possible to achieve a sufficient performance as the thermoelectric conversion element by using only one p-type semiconductor block and one n-type semiconductor block, the thermoelectric conversion element usually employs over ten to several hundreds of p-type semiconductor blocks and n-type semiconductor blocks. Specifically, a thermoelectric conversion module is usually formed by alternately arranging and connecting over ten to several hundreds of the p-type semiconductor blocks and the n-type semiconductor blocks in series between the pair of heat transfer plates. The thermoelectric conversion module includes a pair of extraction electrodes connected to both ends of an aggregate of the p-type semiconductor blocks and the n-type semiconductor blocks connected in series.

When a current is applied to the p-type semiconductor blocks and the n-type semiconductor blocks by connecting the pair of extraction electrodes to a power source, heat is transferred from one of the heat transfer plates to the other heat transfer plate by the Peltier effect. Meanwhile, when a temperature difference is applied between the two heat transfer plates, a potential difference is generated between the p-type semiconductor blocks and the n-type semiconductor blocks by the Seebeck effect, so that a current may be taken out of the extraction electrodes.

Patent Document 1: Japanese Laid-open Patent Publication No. 08-32125
Patent Document 2: Japanese Laid-open Patent Publication No. 2008-91442
Patent Document 3: Japanese Laid-open Patent Publication No. 11-32492

Incidentally, the thermoelectric conversion module is formed by combining the plurality of members having mutually different thermal expansion coefficients, namely, the heat transfer plates made of the insulator, semiconductor blocks made of semiconductor, the electrodes made of metal, and so forth. Moreover, the semiconductor blocks are usually connected to the electrodes by use of solder, but solder also has its own thermal expansion coefficient. For this reason, when a large temperature difference is repeatedly applied between the pair of heat transfer plates, a large strain (thermal strain) may repeatedly occur at junctions of the members and may lead to a disconnection.

As described previously, the plurality of p-type semiconductor blocks and the plurality of n-type semiconductor blocks are connected in series in the thermoelectric conversion module. Therefore, the thermoelectric conversion module may not function even with one disconnection.

Here, concerning a thermoelectric conversion system using a plurality of thermoelectric conversion modules, there is proposed a technique to provide a bypass circuit configured to detect conditions of the respective thermoelectric conversion modules and to automatically bypass a thermoelectric conversion module in which a failure has occurred. By using this technique, it is conceivable to restore the thermoelectric conversion module by bypassing a disconnected portion when a disconnection occurs in the thermoelectric conversion module. However, as described previously, the thermoelectric conversion module includes over ten to several hundreds of the p-type semiconductor blocks and the n-type semiconductor blocks. Accordingly, it is not practicable to prepare the bypass circuit for each of the semiconductor blocks because a huge number of the bypass circuits are necessary.

SUMMARY

According to an aspect, there is provided a thermoelectric conversion module including: a first heat transfer plate and a second heat transfer plate; a plurality of blocks containing a thermoelectric element material and being arranged between the first heat transfer plate and the second heat transfer plate; a plurality of terminal electrodes formed respectively on surfaces of the first heat transfer plate and the second heat transfer plate on the blocks side and connecting the plurality of the blocks in series; and extraction electrodes connected respectively to both ends of an aggregate formed of the blocks connected in series, wherein holes and a groove are formed in at least one of the first heat transfer plate and the second heat transfer plate, the holes reaching to the terminal electrodes from a surface of the corresponding heat transfer plate on an opposite side to the blocks, the groove connecting between the adjacent holes.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Embodiments will be described below with reference to the accompanying drawings.

First Embodiment

Figure 1:
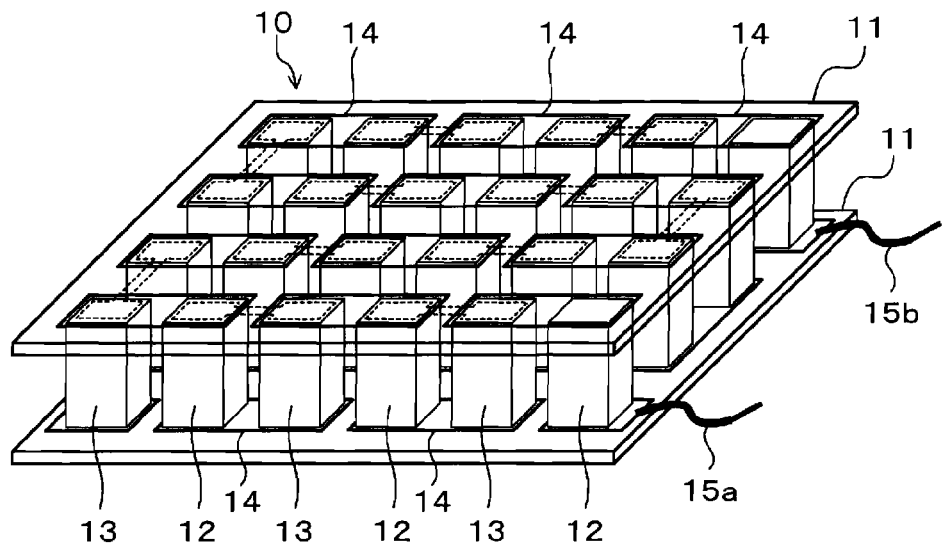
FIG. 1 is a perspective view (a schematic diagram) illustrating a thermoelectric conversion module according to a first embodiment.
Figure 2:
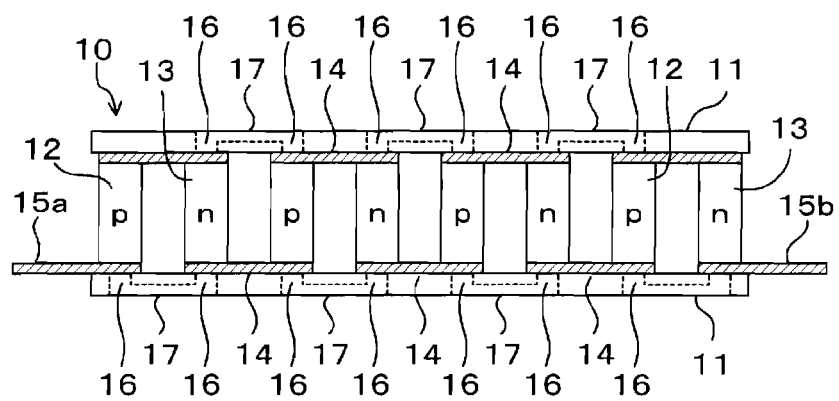
FIG. 2 is a cross-sectional view (a schematic diagram) of the thermoelectric conversion module according to the first embodiment.
Figure 3:
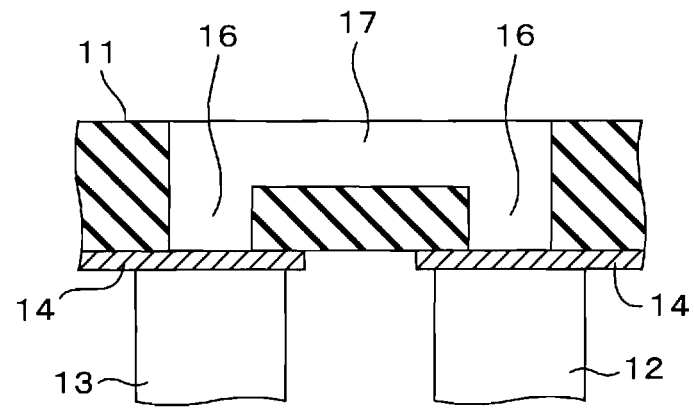
FIG. 3 is an enlarged cross-sectional view illustrating holes and a groove provided in a heat transfer plate of the thermoelectric conversion module according to the first embodiment.

FIG. 1 is a perspective view (a schematic diagram) illustrating a thermoelectric conversion module according to a first embodiment, FIG. 2 is a cross-sectional view (a schematic diagram) of the same, and FIG. 3 is an enlarged cross-sectional view illustrating holes and a groove provided in a heat transfer plate.

A thermoelectric conversion module 10 according to this embodiment is formed by arranging p-type semiconductor blocks 12 and n-type semiconductor blocks 13 alternately and in a matrix fashion between a pair of heat transfer plates 11 made of an insulator having good thermal conductivity. The p-type semiconductor blocks 12 and the n-type semiconductor blocks 13 are connected in series via a plurality of terminal electrodes 14 which are formed on inner surfaces (surfaces on the semiconductor blocks 12 and 13 side) of the heat transfer plates 11. Moreover, extraction electrodes 15a and 15b are connected to both ends of an aggregate of the p-type semiconductor blocks 12 and the n-type semiconductor blocks 13 connected in series.

In this embodiment, each of the heat transfer plates 11 is assumed to be formed of an alumina (aluminum oxide) plate which has a square shape with a side of 4 cm and has a thickness of 0.8 mm. Meanwhile, each of the p-type semiconductor blocks 12 is assumed to be made of $Bi_{0.5}Se_{1.5}Te_3$ and each of the n-type semiconductor blocks 13 is assumed to be made of $Bi_2Te_{2.85}Se_{0.15}$. The dimensions of each of these semiconductor blocks 12 and 13 are set to a bottom surface of 3 mm×3 mm and a height of 5 mm. Meanwhile, there are twelve p-type semiconductor blocks 12 and twelve n-type semiconductor blocks 13 provided therein. In other words, there are twelve p-n pairs. It is to be noted, however, that the material and the dimensions of the heat transfer plates 11, as well as the compositions, the dimensions, and the numbers, and other factors of the p-type semiconductor blocks 12 and the n-type semiconductor blocks 13 are not limited only to the above-mentioned examples and may be selected as appropriate.

Each of the terminal electrodes 14 is made of a copper thin film. Meanwhile, Ni is plated on each of end surfaces of the semiconductor blocks 12 and 13 and the terminal electrodes 14 are bonded to the semiconductor blocks 12 and 13 by use of BiSn-based solder. Here, BiSn solder having a Bi content of about 58 wt % and a Sn content of about 42 wt % is assumed to be used for electrically connecting the terminal electrodes 14 to the semiconductor blocks 12 and 13.

As illustrated in FIG. 3, each of the heat transfer plates 11 includes holes 16, which reach from an outer surface (the surface on the opposite side to the semiconductor blocks 12 and 13) to the terminal electrodes 14, in positions corresponding to the respective semiconductor blocks 12 and 13. Dimensions of each hole 16 may be large enough to allow insertion of a tip end of a test pin of a digital tester to be described later. Here, the dimensions of each hole 16 are assumed to be 2 mm×2 mm.

Meanwhile, grooves 17 connecting between the holes 16 are formed on the outer surface of the heat transfer plate 11 in positions corresponding to regions between the semiconductor blocks 12 and 13 which are not connected by the terminal electrodes 14 among the adjacent semiconductor blocks 12 and 13. A depth of each groove 17 is set to 0.4 mm, a width thereof is set to 0.8 mm, and a length thereof is set to 2 mm, for example. Dimensions of the grooves 17 are not limited only to the above-described example and may be selected as appropriate.

This thermoelectric conversion element 10 is used as a thermoelectric generating element. For example, one of the heat transfer plates 11 becomes a temperature of 0° C. while the other heat transfer plate 11 becomes a temperature of 100° C. When thermoelectric conversion module 10 is used for a long period, a disconnection occurs in a position between any of the semiconductor blocks 12 and 13 and the terminal electrode 14 due to repetition of thermal expansion or other factors in some cases.

Now, a method of restoring a disconnection in the above-described thermoelectric conversion module will be described below with reference to a schematic diagram in FIG. 4.

Figure 4:
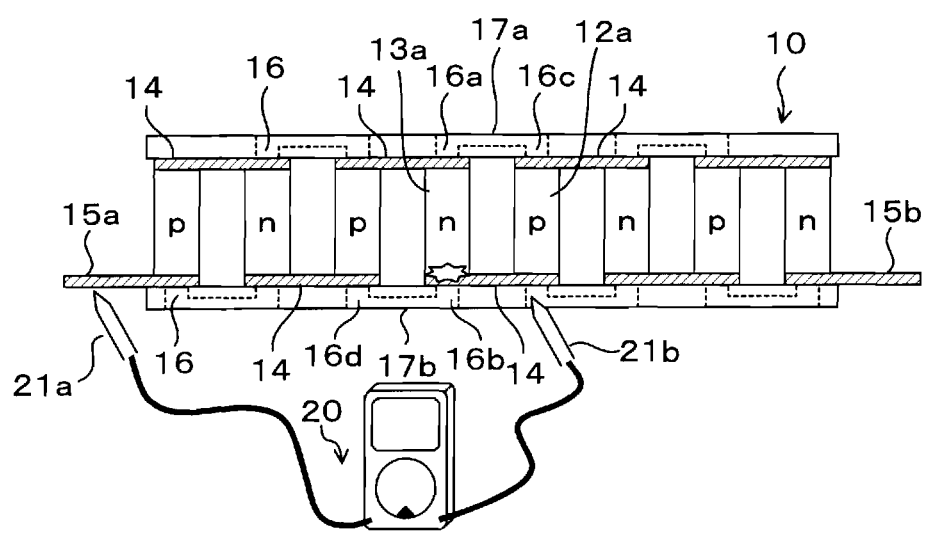
FIG. 4 is a schematic diagram illustrating a method of restoring a disconnection in the thermoelectric conversion module according to the first embodiment (part 1)

It is assumed that a disconnection due to repetition of thermal expansion associated with usage for a long period occurs in the thermoelectric conversion module 10 illustrated in FIG. 4, and that an output from the extraction electrodes 15a and 15b is not obtained. In this case, a test pin 21a of a digital tester 20 is connected to the extraction electrode 15a (or the extraction electrode 15b) as illustrated in FIG. 4. Then, another test pin 21b is sequentially (in the order of connection) brought into contact with the terminal electrodes 14 starting from the nearest side to the extraction electrode 15a (or the extraction electrode 15b) so as to check conduction between the extraction electrode 15a (or the extraction electrode 15b) and each of the terminal electrodes 14. However, the test pin 21b may not be inserted to all of the holes 16. Instead, the test pin 21b may be inserted to one of two holes 16 which are connected to one terminal electrode 14. Here, as illustrated in FIG. 4, it is assumed that conduction is confirmed at the hole 16a and that conduction is lost at the hole 16b. In this case, it is conceivable that a disconnection (a connection failure) occurs between a semiconductor block 13a and the terminal electrode 14 located either on an upper side or on a lower side thereof.

After the disconnected portion is specified as described above, epoxy-based conductive paste (such as Dotite FA-33 manufactured by Fujikura Kasei Co., Ltd) is injected into the hole 16a, a groove 17a connected to the hole 16a, and a hole 16c. In this case, it is preferable to inject an adequate amount of the conductive paste for ensuring electrical connection between the terminal electrode 14 connected to the hole 16a and the terminal electrode 14 connected to the hole 16c. However, it may be also important to leave a space to be filled with insulative filler in a subsequent process instead of fully injecting the conductive paste so as to bury the holes 16a and 16c as well as the groove 17a.

In this embodiment, the conductive paste is injected into the hole 16a on the upper side of the semiconductor block 13a, the groove 17a connected to the hole 16a, and the hole 16c. Instead, the conductive paste may be injected into the hole 16b on the lower side of the semiconductor block 13a, a groove 17b connected to the hole 16b, and a hole 16d.

Figure 5:
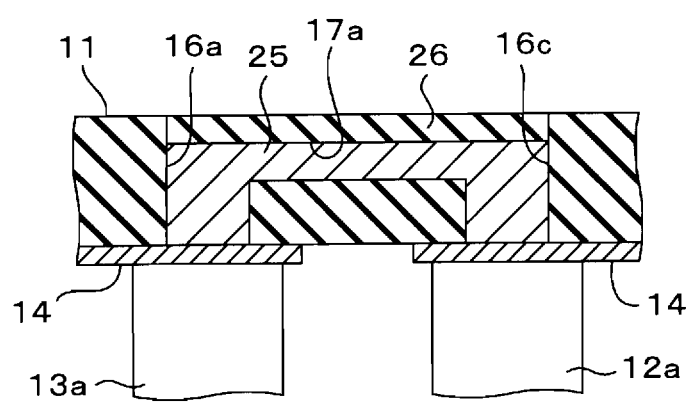
FIG. 5 is a schematic diagram illustrating the method of restoring a disconnection in the thermoelectric conversion module according to the first embodiment (part 2)

After injecting the conductive paste into the holes 16a and 16c as well as the groove 17a as described above, the conductive paste is cured by performing a heat treatment for 30 minutes at a temperature of 150° C., for example. Then, in order to ensure insulation on the outer surface of the heat transfer plate 11, insulative filler (such as Aron Ceramic D manufactured by Toagosei Co., Ltd.) 26 is injected onto the cured conductive paste 25 as illustrated in FIG. 5, and the insulative filler 26 is cured by performing a heat treatment for 150 minutes at a temperature of 150° C. in the atmosphere.

Restoration of the thermoelectric conversion module 10 in which the disconnection has occurred is completed by forming a conductive path for bypassing the n-type semiconductor block 13a where the disconnection has occurred and the p-type semiconductor block 12a adjacent thereto as described above. The thermoelectric conversion module 10 after the restoration reduces one pair of the p-n pairs. Accordingly, a thermoelectric conversion output after the restoration becomes 11/12 as compared to a thermoelectric conversion output before the restoration (before occurrence of the disconnection). Nevertheless, this reduction in the output falls within tolerance and may not pose a practical problem.

Although the epoxy-based conductive paste is employed as a restorative material for the disconnected portion in this embodiment, SnPd-based, BiSn-based, or SnAg-based solder, for example, may be employed instead of the conductive paste. In this case, a difference in the thermal expansion coefficient between the solder and copper constituting the terminal electrode 14 is small, and thus high reliability of the restored portion in repetition of thermal expansion is possessed.

Meanwhile, the melting point of typical solder is highly dependent on the composition but is relatively as low as 200° C. or below. On the other hand, it may be possible to use some type of the above-described epoxy-based conductive paste at a high temperature of 250° C. or above once after being cured.

The usage of either the conductive paste or the solder as the restorative material for the disconnected portion may be appropriately selected depending on conditions of use of the thermoelectric conversion module 10 and other factors.

The embodiment has described the case of detecting and restoring the disconnected portion of the thermoelectric conversion module 10. However, there may also be a case where a local failure less serious than the disconnection occurs due to deterioration or the like of any of the element materials. In this case, the following steps, for example, may be performed. That is, resistance values are measured by sequentially connecting the test pin of the digital tester to the terminal electrodes 14 on both sides of the semiconductor blocks 12 and 13, and then occurrence of a failure is determined if any of the measured values exceeds a reference value (such as a value which is ten percent higher than an initial resistance value), and then restoration is performed by similar procedures to the above-described embodiment. The same applies to the embodiments to be described later.

Modified Example

The above-described first embodiment is configured to specify the disconnected portion by connecting the test pin 21a of the digital tester 20 to the extraction electrode 15a while sequentially connecting the other test pin 21b to the terminal electrodes 14 starting from the nearest side to the extraction electrode 15a so as to check the conduction. In this case, if there are N pieces of the semiconductor blocks, then it is preferable to carry out N−1 inspections at the maximum. In the following, a method of specifying the disconnected portion by carrying out fewer inspections will be described.

Figure 6:
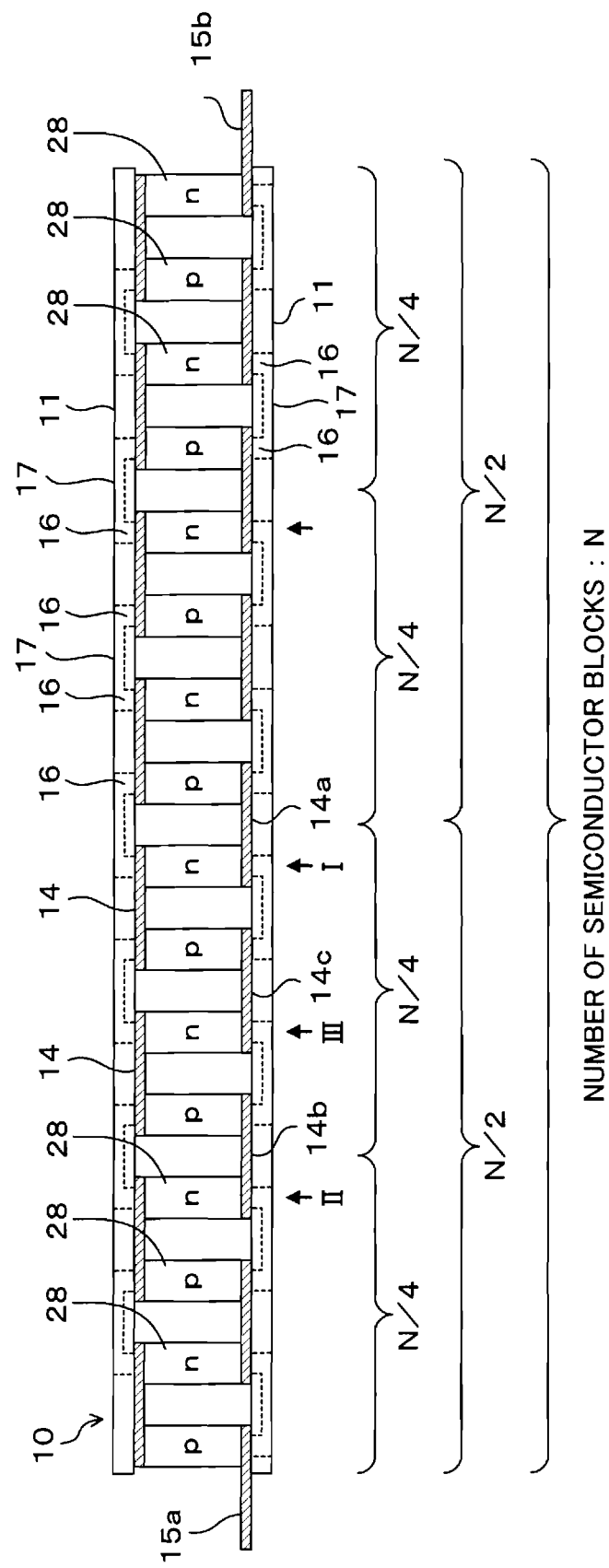
FIG. 6 is a view illustrating an example of a method of searching for a disconnected portion.

Here, as illustrated in FIG. 6, the thermoelectric conversion module 10 is assumed to include N pieces (N=16) of the semiconductor blocks. Note that the p-type semiconductor blocks and the n-type semiconductor blocks are denoted by reference numeral 28 in FIG. 6.

First, the test pin 21a of the digital tester 20 (see FIG. 4) is connected to the extraction electrode 15a and the other test pin 21 is connected to a terminal electrode 14a connected to a N/2-th semiconductor block 28. The hole 16 where the test pin 21b is supposed to be inserted at this time is indicated with an arrow I in FIG. 6.

Here, a disconnected portion turns out to be located between the extraction electrode 15a and the terminal electrode 14a if no conduction is confirmed and the disconnected portion turns out to be located between the terminal electrode 14a and the extraction electrode 15b if the conduction is confirmed. It is assumed that no conduction is confirmed herein and that the disconnected portion turns out to be located between the extraction electrode 15a and the terminal electrode 14a.

Next, the other test pin 21b is connected to a terminal electrode 14b connected to a N/4-th semiconductor block 28 while the test pin 21a of the digital tester 20 is kept connected to the extraction electrode 15a. The hole 16 where the test pin 21b is supposed to be inserted at this time is indicated with an arrow II in FIG. 6.

Here, the disconnected portion turns out to be located between the extraction electrode 15a and the terminal electrode 14b if no conduction is confirmed and the disconnected portion turns out to be located between the terminal electrode 14b and the terminal electrode 14a if the conduction is confirmed. It is assumed that conduction is confirmed herein and that the disconnected portion turns out to be located between the terminal electrode 14b and the terminal electrode 14a.

Next, the test pin 21a is connected to a terminal electrode 14c connected to a (N/4+N/8)-th semiconductor block 28 while the test pin 21b of the digital tester 20 is kept connected to the terminal electrode 14a. The hole 16 where the test pin 21a is supposed to be inserted at this time is indicated with an arrow III in FIG. 6.

Here, the disconnected portion turns out to be located between the terminal electrode 14b and the terminal electrode 14c if conduction is confirmed and the disconnected portion turns out to be located between the terminal electrode 14c and the terminal electrode 14a if no conduction is confirmed.

As described above, it may be possible to specify the disconnected portion in fewer inspections by repeating the operations to divide the inspection range in half and to check as to on which side the disconnection (or the failure) is present. If the number of the semiconductor blocks 28 is N, then it may be possible to specify the disconnected portion within about $Log_2 N$ inspections.

Second Embodiment

Figure 7:
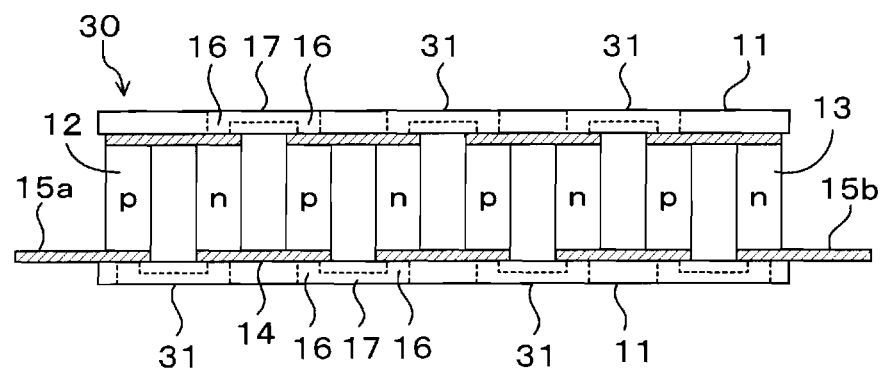
FIG. 7 is a cross-sectional view (a schematic diagram) illustrating a thermoelectric conversion module according to a second embodiment.
Figure 8:
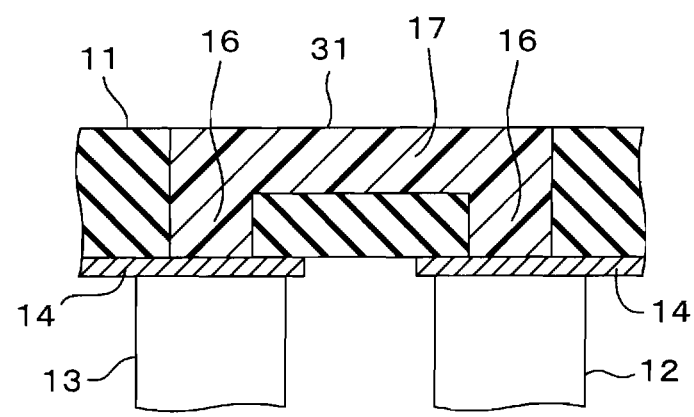
FIG. 8 is an enlarged cross-sectional view illustrating holes and a groove provided in a heat transfer plate of the thermoelectric conversion module according to the second embodiment.

FIG. 7 is a cross-sectional view (a schematic diagram) illustrating a thermoelectric conversion module according to a second embodiment, and FIG. 8 is an enlarged cross-sectional view illustrating holes and a groove provided in a heat transfer plate. In FIG. 7 and FIG. 8, the same constituents as those appearing in FIG. 2 and FIG. 3 are designated by the same reference numerals.

A thermoelectric conversion module 30 of this embodiment is different from the thermoelectric conversion module 10 of the first embodiment in that rubber caps 31 are inserted to the holes 16 and the grooves 17 provided in the heat transfer plates 11. Other basic structures are similar to those in the first embodiment.

The rubber caps 31 are made of rubber (resin) having good thermal conductivity. Here, the rubber caps 31 are assumed to be made of heat dissipation silicone rubber (TC-BG) manufactured by Shin-Etsu Chemical Co., Ltd. The density of alumina constituting the heat transfer plates 11 is equal to about 4 $g/cm^3$. Meanwhile, the density of the above-described heat dissipation silicone rubber is equal to about 1.5 $g/cm^3$.

Figure 9:
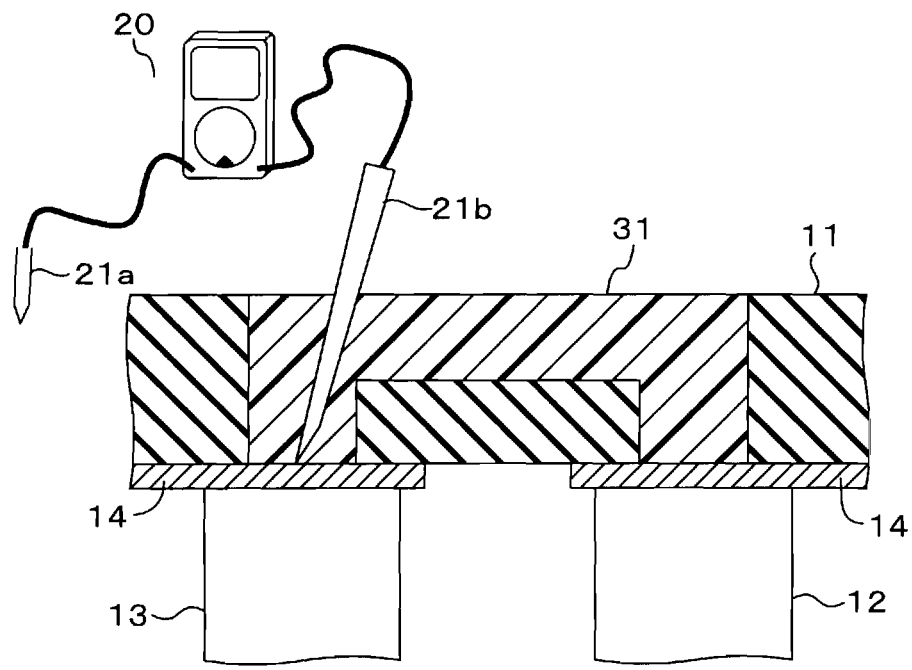
FIG. 9 is a schematic diagram illustrating a method of restoring a disconnection in the thermoelectric conversion module according to the second embodiment (part 1)
Figure 10:
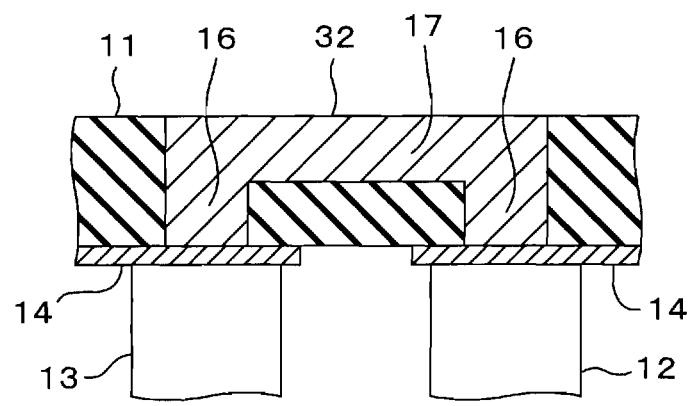
FIG. 10 is a schematic diagram illustrating the method of restoring a disconnection in the thermoelectric conversion module according to the second embodiment (part 2)

Now, a method of restoring a disconnection in the above-described thermoelectric conversion module 30 will be described below with reference to FIG. 9 and FIG. 10.

In this embodiment as well, the test pin 21a of the digital tester 20 is connected to the extraction electrode 15a (or the extraction electrode 15b) as similar to the first embodiment, for example. Then, the other test pin 21b is sequentially brought into contact with the terminal electrodes 14 starting from the nearest side to the extraction electrode 15a (or the extraction electrode 15b) so as to judge conduction between the extraction electrode 15a (or the extraction electrode 15b) and each of the terminal electrodes 14. In this case, the rubber cap 31 may not be detached as illustrated in FIG. 9. Instead, the test pin 21b is brought into contact with the terminal electrode 14 by sticking the tip of the test pin 21b into the rubber cap 31.

After the disconnected portion is specified as similar to the first embodiment, the rubber cap 31 in a position corresponding to the disconnected portion is detached. Then a repair fitting 32 prepared in advance, which is made of a metal thin plate, is fitted into the holes 16 and the groove 17 for caulking as illustrated in FIG. 10. The terminal electrode 14 in the disconnected portion and the terminal electrode 14 adjacent to the terminal electrode 14 in the disconnected portion are electrically connected (bypassed) by this repair fitting 32. In this way, the restoration of the disconnected portion is completed.

In the first embodiment, the holes 16 and the grooves 17 of the heat transfer plates 11 are filled with air having low thermal conductivity. Hence the thermal conductivity of the heat transfer plates 11 is reduced as compared to the case without the holes 16 and the grooves 17. On the other hand, according to this embodiment, the caps 31 made of the silicone rubber having good thermal conductivity are inserted in advance to the holes 16 and the grooves 17 on the heat transfer plates 11. Therefore, it may be possible to suppress reduction in the thermal conductivity of the heat transfer plates 11. Moreover, the rubber caps 31 may not be detached when inspecting the conduction. Therefore, it may be possible to suppress reduction in operating efficiency at the time of inspecting the conduction.

Here, in this embodiment as well, the restoration may be performed by injecting the conductive paste into the holes 16 and the groove 17 corresponding to the disconnected portion as similar to the first embodiment. Meanwhile, the disconnected portion may be searched in accordance with the method described in the above-described modified example.

Third Embodiment

Figure 11:
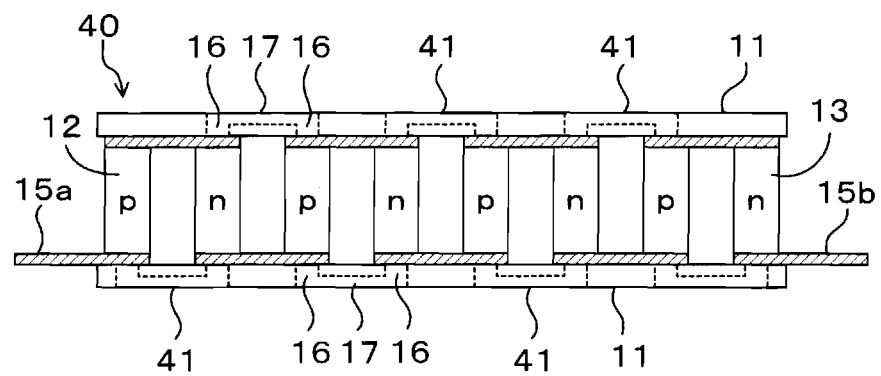
FIG. 11 is a cross-sectional view (a schematic diagram) illustrating a thermoelectric conversion module according to a third embodiment.
Figure 12:
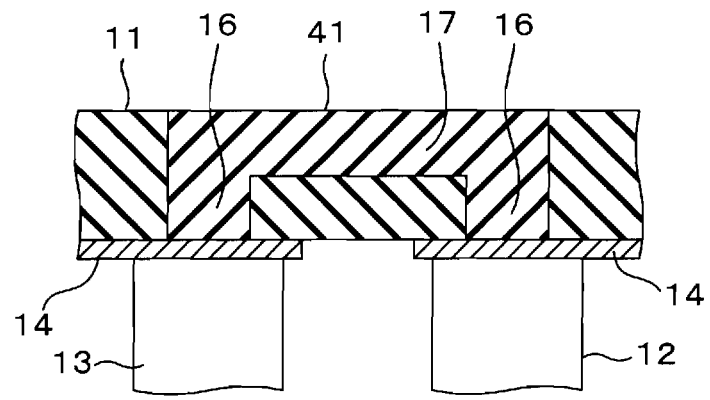
FIG. 12 is an enlarged cross-sectional view illustrating holes and a groove provided in a heat transfer plate of the thermoelectric conversion module according to the third embodiment.

FIG. 11 is a cross-sectional view (a schematic diagram) illustrating a thermoelectric conversion module according to a third embodiment, and FIG. 12 is an enlarged cross-sectional view illustrating holes and a groove provided in a heat transfer plate. In FIG. 11 and FIG. 12, the same constituents as those appearing in FIG. 2 and FIG. 3 are designated by the same reference numerals.

A thermoelectric conversion module 40 of this embodiment is different from the thermoelectric conversion module 10 of the first embodiment in that ceramic caps 41 are inserted to the holes 16 and the grooves 17 provided in the heat transfer plates 11. Other basic structures are similar to those in the first embodiment.

In this embodiment, the ceramic caps 41 are made of the same material as that of the heat transfer plates 11, namely alumina. Accordingly, the thermal conductivity, the density, and the thermal expansion coefficient of the ceramic caps 41 are the same as those of the heat transfer plates 11.

Now, a method of restoring a disconnection in the above-described thermoelectric conversion module 40 will be described below with reference to FIG. 13.

In this embodiment, the ceramic caps 41 are detached from the heat transfer plates 11 when the position where a disconnection has occurred is searched for. Then, as similar to the first embodiment (see FIG. 4), for example, the test pin 21a of the digital tester 20 is connected to the extraction electrode 15a. Then, the other test pin 21b is sequentially brought into contact with the terminal electrodes 14 starting from the nearest side to the extraction electrode 15a so as to judge conduction.

Figure 13:
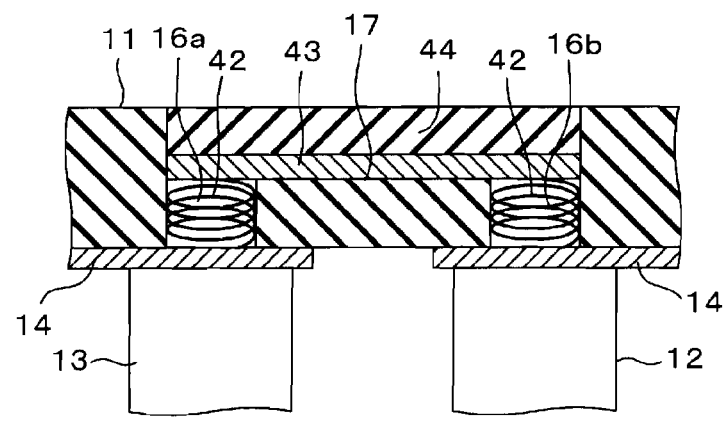
FIG. 13 is a schematic diagram illustrating a method of restoring a disconnection in the thermoelectric conversion module according to the third embodiment.

After the disconnected portion is specified as described above, metallic springs 42 are inserted to a hole 16a in a position corresponding to the disconnected portion and a hole 16b to be connected to the hole 16a via the groove 17 as illustrated in FIG. 13. Then, a metallic plate 43 is put on these springs 42, and the terminal electrode 14 in the disconnected portion is electrically connected to the terminal electrode 14 adjacent to the terminal electrode 14 in the disconnected portion by use of resilience of the springs 42 and the metallic plate 43. In this case, the metallic plate 43 is preferably brought into contact with a bottom of the groove as illustrated in FIG. 13.

Thereafter, a ceramic-based adhesive 44 (such as Aron Ceramic D manufactured by Toagosei Co., Ltd.) is injected onto the metallic plate 43, and the ceramic-based adhesive 44 is cured by performing a heat treatment for 180 minutes at a temperature of 150° C., for example. Meanwhile, the ceramic caps 41 are inserted back to the holes 16 and the grooves 17 in the positions other than the restored position. In this way, the restoration of the disconnected portion is completed.

In this embodiment, the ceramic caps 41 made of the same material as the heat transfer plates 11 are inserted to the holes 16 and the grooves 17 provided in the heat transfer plates 11. Accordingly, the thermal conduction efficiency of the heat transfer plates 11 is improved as compared to the first embodiment. Moreover, since the disconnected portion is restored by use of the metallic springs 42, the metallic plate 43, and the ceramic-based adhesive 44 in this embodiment, the restored position may bear a high temperature of 500° C. or above, for example. Therefore, the restoring method according to this embodiment may be also applicable to a thermoelectric conversion module used at a high temperature.

Fourth Embodiment

Figure 14:
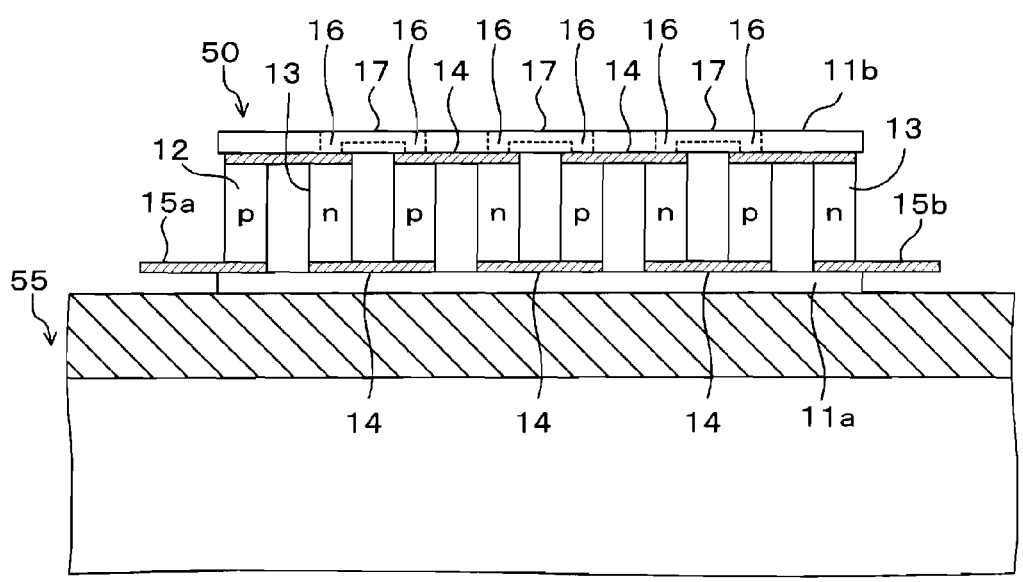
FIG. 14 is a schematic diagram illustrating a method of restoring a thermoelectric conversion module according to the fourth embodiment (part 1)

FIG. 14 is a schematic diagram illustrating a method of restoring a thermoelectric conversion module according to the fourth embodiment. In FIG. 14, the same constituents as those appearing in FIG. 1 are designated by the same reference numerals.

A thermoelectric conversion module 50 of this embodiment is joined to a stainless-steel wall of a heating furnace 55, and may not be detached from the wall of the heating furnace 55. This thermoelectric conversion module 50 generates power by use of heat from the heating furnace 55.

As similar to the thermoelectric conversion module 10 of the first embodiment, the thermoelectric conversion module 50 is formed by alternately arranging a plurality of p-type semiconductor blocks 12 and n-type semiconductor blocks 13 between a pair of heat transfer plates 11a and lib. The p-type semiconductor blocks 12 and the n-type semiconductor blocks 13 are connected in series via a plurality of terminal electrodes 14 which are formed on inner surfaces (surfaces on the semiconductor blocks 12 and 13 side) of the heat transfer plates 11a and 11b. Moreover, extraction electrodes 15a and 15b are connected to both ends of an aggregate of the p-type semiconductor blocks 12 and the n-type semiconductor blocks 13 connected in series.

The heat transfer plate 11b not contacting the wall of the heating furnace 55 includes holes 16 reaching from an outer surface to the terminal electrodes 14 as similar to the first embodiment, and grooves 17 each communicating between two holes 16 respectively reaching to two terminal electrodes 14 adjacent to each other. However, the heat transfer plate 11a contacting the wall of the heating furnace 55 does not include any holes or grooves.

Now, a method of restoring a disconnection in the above-described thermoelectric conversion module will be described below.

In the case of the thermoelectric conversion module 50 according to this embodiment, it may not be possible to bring test pins of a digital tester into contact with the terminal electrodes 14 on the heat transfer plate 11a side in case of a disconnection. However, in this embodiment as well, conduction is checked by bringing a test pin of the digital tester into contact with the extraction electrode 15a and bringing another test pin sequentially in contact with the terminal electrodes 14 on the heat transfer plate 11b side starting from the nearest side to the extraction electrode 15a.

Figure 15:
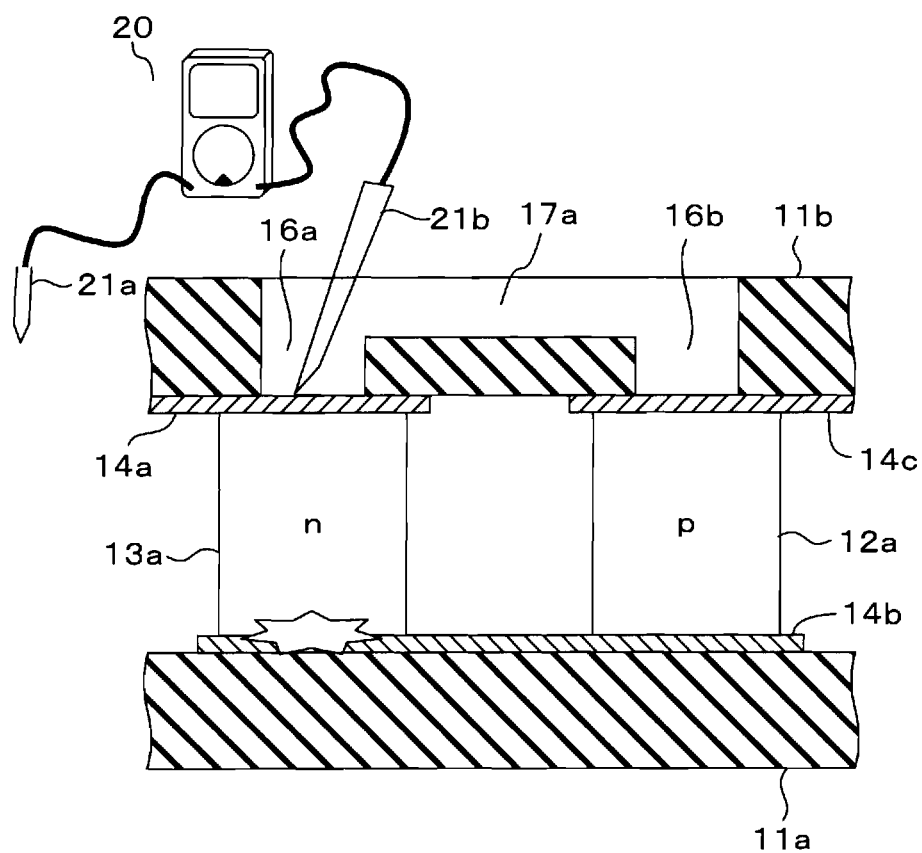
FIG. 15 is a schematic diagram illustrating the method of restoring the thermoelectric conversion module according to the fourth embodiment (part 2)

For example, a disconnection is assumed to occur in a position between an n-type semiconductor block 13a and a terminal electrode 14b on a lower side thereof as illustrated in FIG. 15. In order to specify the disconnected portion, the test pin 21a of the digital tester 20 is connected to the extraction electrode 15a and the other test pin 21b is sequentially brought into contact with the terminal electrodes 14 starting from the nearest side to the extraction electrode 15a as described previously. Here, it is assumed that conduction is confirmed on and before a terminal electrode 14a on the upper side of the n-type semiconductor block 13a and that conduction is lost at a terminal electrode 14c on the upper side of a p-type semiconductor block 12a. In this case, it is conceivable that a disconnection occurs in any of a space between the n-type semiconductor block 13a and the terminal electrode 14a on the upper side thereof, a space between the n-type semiconductor block 13a and the terminal electrode 14b on the lower side thereof, a space between the p-type semiconductor block 12a and the terminal electrode 14b on the lower side thereof, and a space between the p-type semiconductor block 12a and the terminal electrode 14c on the upper side thereof.

In this embodiment, conductive paste (such as Dotite FA-33) is injected into holes 16a and 16b as well as a groove 17a collectively connecting the terminal electrode 14a where the conduction is confirmed and the terminal electrode 14b where the conduction is not confirmed adjacent to the terminal electrode 14a as similar to the first embodiment. Then, the conductive paste is cured by heating for 60 minutes at a temperature of 150° C. using a dryer, for example. Thus, the terminal electrodes 14a and 14c are connected to each other via the conductive paste. Meanwhile, insulative filler is injected onto the conductive paste as appropriate so as to ensure insulation on the surface of the heat transfer plate 11b. Here, the repair fitting as described in the second embodiment, or the springs and the metallic plate as described in the third embodiment may be used instead of the conductive paste.

In this way, it may be possible to restore the disconnected portion easily and reliably even when the holes 16 and the grooves 17 are formed in the heat transfer plate 11b as one of the heat transfer plates 11a and 11b.

Fifth Embodiment

Figure 16:
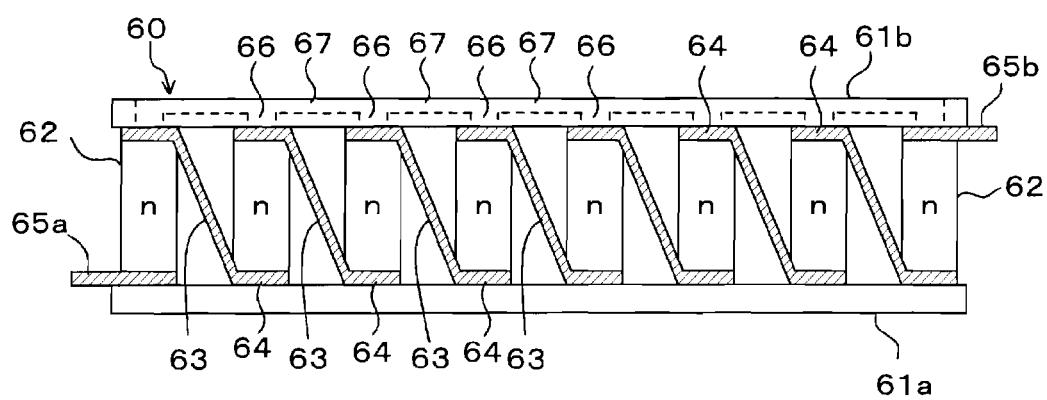
FIG. 16 is a cross-sectional view (a schematic diagram) illustrating a thermoelectric conversion module according to a fifth embodiment.

FIG. 16 is a cross-sectional view (a schematic diagram) illustrating a thermoelectric conversion module according to a fifth embodiment.

A thermoelectric conversion module 60 of this embodiment includes a plurality of n-type semiconductor blocks 62 which are arranged at a certain pitch between a pair of heat transfer plates 61a and 61b. The heat transfer plates 61a and 61b are both made of an insulator having good thermal conductivity such as alumina. Meanwhile, the n-type semiconductor blocks 62 are made of an oxide such as $CaMnO_3$.

Terminal electrodes 64 to be connected to the semiconductor blocks 62 are provided on inner surfaces (surfaces on the semiconductor blocks 62 side) of the heat transfer plates 61a and 61b. Moreover, the terminal electrodes 64 on the heat transfer plate 61a side of the semiconductor blocks 62 are electrically connected to the terminal electrodes 64 on the heat transfer plate 61b side of the adjacent semiconductor blocks 62 via connecting members 63. Specifically, the plurality of n-type semiconductor blocks 62 arranged between the heat transfer plates 61a and 61b are connected in series via the terminal electrodes 64 and the connecting members 63. Extraction electrodes 65a and 65b are connected to both ends of an aggregate of these semiconductor blocks 62 connected in series.

In this embodiment as well, holes 66 which reach from an outer surface to the terminal electrodes 64, and grooves 67 connecting between the adjacent holes 66 are provided in the heat transfer plate 61b in positions corresponding to the respective n-type semiconductor blocks 62. On the other hand, the other heat transfer plate 61a does not include any holes or grooves.

Now, a method of restoring a disconnection in the above-described thermoelectric conversion module will be described below.

If a disconnection occurs in the thermoelectric conversion module 60, a test pin of a digital tester is connected to the extraction electrode 65a as similar to the fourth embodiment. Then, another test pin is sequentially brought into contact with the terminal electrodes 64 on the heat transfer plate 61b side starting from the nearest side to the extraction electrode 65a so as to judge conduction and to specify the disconnected portion.

When the disconnected portion is specified, conductive paste is injected into a hole 66 above the semiconductor block 62 in the disconnected portion, a hole 66 adjacent to the hole 66 above the semiconductor block 62 in the disconnected portion, and a groove 67 connecting between these holes 66 as similar to the first embodiment, for example. Thereafter, the conductive paste is cured by heating for 60 minutes at a temperature of 150° C. using a dryer, for example. The terminal electrodes 64 in the disconnected portion are electrically connected to each other via this conductive paste. Meanwhile, insulative filler is injected onto the conductive paste as appropriate so as to ensure insulation on the surface of the heat transfer plate 61b. Here, the conduction between the terminal electrodes 64 in the disconnected portion may be ensured by using the repair fitting as described in the second embodiment, or the springs and the metallic plate as described in the third embodiment instead of the conductive paste. In this way, the restoration of the thermoelectric conversion module according to this embodiment is completed.

It may be possible to restore the disconnected portion easily and reliably in this embodiment as well. Although this embodiment has described the case of forming the thermoelectric conversion module by use of the n-type semiconductor blocks, it may be also possible to form the thermoelectric conversion module by use of the p-type semiconductor modules.

The embodiments described above have explained the case of forming the blocks (the semiconductor blocks) by using any of the BiTe material ($Bi_{0.5}Sb_{1.5}Te_3$ and $Bi_2Te_{2.85}Se_{0.15}$) and the transition metal oxide ($CaMnO_3$) as the thermoelectric element material. However, the blocks may be made of other thermoelectric element materials.

The thermoelectric element materials include BiTe materials, PbTe materials, SiGe materials, silicide materials, skutterudite materials, transition metal oxide materials, zinc-antimony materials, boron compounds, cluster solid materials, carbon nanotube, and so forth.

The BiTe materials include BiTe, SbTe, BiSe, and compounds thereof. Meanwhile, the PbTe materials include PbTe, SnTe, AgSbTe, GeTe, and compounds thereof. Further, the SiGe materials include Si, Ge, SiGe, and the like. The silicide materials include FeSi, MnSi, and CeSi. The skutterudite materials are compounds expressed by $MX_3$ or $RM_4X_{12}$.

Here, M is an element selected from Co, Rh, and Ir. X is an element selected from As, P, and Sb. R is an element selected from La, Yb, and Ce.

The transition metal oxides materials include CaMnO, NaCoO, ZnInO, SrTiO, BiSrCoO, PbSrCoO, CaBiCoO, BaBiCoO, and so forth. Meanwhile, the zinc-antimony materials include ZnSb, and the boron compound materials include CeB, BaB, SrB, CaB, MgB, VB, NiB, CuB, LiB, and so forth, for example. Moreover, the cluster solid materials include B cluster, Si cluster, C cluster, AlRe, and AlReSi. Further, zinc oxide materials include ZnO, for example.

An appropriate material may be selected from these thermoelectric element materials depending on a usage environment of the thermoelectric conversion module and on other factors.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present inventions have been described in detail, it should be understood that the various changes, substitutions, and alterations could be made hereto without departing from the spirit and scope of the invention.

What is claimed is:

1. A thermoelectric conversion module comprising:
a first heat transfer plate and a second heat transfer plate;
a plurality of blocks containing a thermoelectric element material and being arranged between the first heat transfer plate and the second heat transfer plate;
a plurality of terminal electrodes formed respectively on surfaces of the first heat transfer plate and the second heat transfer plate on the blocks side and connecting the plurality of the blocks in series; and
extraction electrodes connected respectively to both ends of an aggregate formed of the blocks connected in series,
wherein holes and a groove are formed in at least one of the first heat transfer plate and the second heat transfer plate, the holes reaching to the terminal electrodes from a surface of the corresponding heat transfer plate on an opposite side to the blocks, the groove communicating between the adjacent holes.

2. The thermoelectric conversion module according to claim 1, wherein the holes and the groove are formed on both the first heat transfer plate and the second heat transfer plate.

3. The thermoelectric conversion module according to claim 1, wherein a cap made of resin is detachably inserted into the holes and the groove.

4. The thermoelectric conversion module according to claim 1, wherein a cap made of the same material as a material of the heat exchange plates is detachably inserted into the holes and the groove.

5. The thermoelectric conversion module according to claim 1, wherein the blocks are made of any one of a BiTe-based semiconductor material, a PbTe-based semiconductor material, and a SiGe-based semiconductor material.

6. The thermoelectric conversion module according to claim 1, wherein all of the plurality of blocks are made of semiconductor of the same conductivity type.

7. The thermoelectric conversion module according to claim 1, wherein the blocks comprise:
p-type semiconductor blocks made of a p-type semiconductor material; and n-type semiconductor blocks made of an n-type semiconductor material, and the aggregate is formed by alternately connecting the p-type semiconductor blocks and the n-type semiconductor blocks.

8. The thermoelectric conversion module according to claim 1, wherein the blocks are made of a transition metal oxide.

9. The thermoelectric conversion module according to claim 7, wherein the groove is formed in a region between the blocks being not connected to each other by the terminal electrode among the adjacent blocks.

10. A method of restoring a thermoelectric conversion module comprising: a first heat transfer plate and a second heat transfer plate; a plurality of blocks made of a thermoelectric element material and being arranged between the first heat transfer plate and the second heat transfer plate; a plurality of terminal electrodes formed respectively on surfaces of the first heat transfer plate and the second heat transfer plate on the blocks side and connecting the plurality of the blocks in series; and extraction electrodes connected respectively to both ends of an aggregate formed of the blocks connected in series, wherein holes and a groove are formed on at least one of the first heat transfer plate and the second heat transfer plate, the holes reaching to the terminal electrodes from a surface of the corresponding heat transfer plate on an opposite side to the blocks, the groove communicating between the adjacent holes, the method comprising:

specifying a disconnected portion by bringing a test pin of a tester into contact with the terminal electrode via the hole; and electrically connecting between the terminal electrode connected to the block in the disconnected portion and the terminal electrode adjacent to the terminal electrode connected to the block in the disconnected portion via the holes and the groove.

11. The method of restoring a thermoelectric conversion module according to claim 10, wherein the electrical connecting between the terminal electrodes is made by injecting conductive paste into the holes and the groove.

12. The method of restoring a thermoelectric conversion module according to claim 10, wherein the electrical connecting between the terminal electrodes is made by injecting solder into the holes and the groove.

13. The method of restoring a thermoelectric conversion module according to claim 10, wherein the electrical connecting between the terminal electrodes is made by inserting a repair fitting made of a metallic plate into the holes and the groove.

14. The method of restoring a thermoelectric conversion module according to claim 10, wherein the electrical connecting between the terminal electrodes is made by using metallic springs disposed inside the holes, and a metallic plate disposed inside the holes and the groove and electrically connecting between the metallic springs.

15. The method of restoring a thermoelectric conversion module according to claim 10, wherein the holes and the groove are further filled with insulative filler to ensure insulation on a surface of the corresponding heat transfer plate.

16. The method of restoring a thermoelectric conversion module according to claim 10, wherein the test pin is connected only to the terminal electrodes provided on any one of the first heat transfer plate and the second heat transfer plate.

17. The method of restoring a thermoelectric conversion module according to claim 10, wherein the blocks comprise:

p-type semiconductor blocks made of a p-type semiconductor material; and n-type semiconductor blocks made of an n-type semiconductor material, and the aggregate is formed by alternately connecting the p-type semiconductor blocks and the n-type semiconductor blocks.

18. The method of restoring a thermoelectric conversion module according to claim 10, wherein all of the plurality of blocks are made of semiconductor of the same conductivity type.

19. The method of restoring a thermoelectric conversion module according to claim 10, wherein the blocks are made of a transition metal oxide.

* * * * *